US005624789A

United States Patent [19]

Rahman et al.

[11] Patent Number: 5,624,789

[45] Date of Patent: Apr. 29, 1997

[54] METAL ION REDUCTION IN TOP ANTI-REFLECTIVE COATINGS FOR PHOTORESISIS

[75] Inventors: M. Dalil Rahman, Warwick; Dana L. Durham, East Greenwich, both of R.I.

[73] Assignee: Hoechst Celanese Corporation, Somerville, N.J.

[21] Appl. No.: 460,392

[22] Filed: Jun. 2, 1995

Related U.S. Application Data

[62] Division of Ser. No. 258,898, Jun. 10, 1994, Pat. No. 5,516,886, which is a continuation of Ser. No. 984,655, Dec. 2, 1992, abandoned, which is a continuation-in-part of Ser. No. 911,604, Jul. 10, 1992, abandoned.

[51] Int. Cl.$^6$ .................... G03C 1/72; G03F 7/00; C02F 1/42
[52] U.S. Cl. .................... 430/311; 430/331; 430/338; 524/466; 524/463; 524/556; 528/482; 528/487; 528/470; 521/26
[58] Field of Search .................... 430/331, 338, 430/311; 524/466, 463, 556; 528/482, 487, 490; 521/26

[56] References Cited

U.S. PATENT DOCUMENTS

| | | |
|---|---|---|
| 2,929,808 | 3/1960 | Ross et al. . |
| 4,033,909 | 7/1977 | Papa . |
| 4,033,910 | 7/1977 | Papa . |
| 4,195,138 | 3/1980 | Ward .................... 525/404 |
| 4,250,031 | 2/1981 | Uejima et al. .................... 210/688 |
| 4,452,883 | 6/1984 | Frenchik et al. . |
| 4,567,130 | 1/1986 | Held . |
| 4,584,261 | 4/1986 | Held . |
| 4,636,540 | 1/1987 | Warfel . |
| 4,721,665 | 1/1988 | Dooley et al. .................... 430/169 |
| 4,747,954 | 5/1988 | Vaughn et al. . |
| 4,784,937 | 11/1988 | Tanaka et al. . |
| 4,833,067 | 5/1989 | Tanaka et al. . |
| 4,914,006 | 4/1990 | Kato et al. . |
| 5,073,622 | 12/1991 | Wojtech et al. . |
| 5,116,715 | 5/1992 | Roland . |
| 5,118,787 | 6/1992 | Furuno . |
| 5,175,078 | 12/1992 | Aoyama et al. . |
| 5,212,044 | 5/1993 | Liang et al. .................... 430/192 |
| 5,284,930 | 2/1994 | Matsumoto et al. .................... 528/482 |
| 5,286,606 | 2/1994 | Rahman et al. . |
| 5,300,628 | 4/1994 | Honda .................... 528/482 |
| 5,350,714 | 9/1994 | Trefonas, III et al. . |
| 5,378,802 | 1/1995 | Honda .................... 528/480 |
| 5,446,125 | 8/1995 | Honda et al. .................... 528/486 |
| 5,472,616 | 12/1995 | Szmanda et al. .................... 210/683 |
| 5,476,750 | 12/1995 | Rahman et al. .................... 430/270.1 |
| 5,500,127 | 3/1996 | Carey et al. .................... 210/685 |
| 5,516,886 | 5/1996 | Rahman et al. .................... 528/482 |
| 5,521,052 | 5/1996 | Rahman et al. .................... 430/270.1 |
| 5,543,263 | 8/1996 | Rahman et al. .................... 430/168 |

FOREIGN PATENT DOCUMENTS

| | | |
|---|---|---|
| 544324 | 6/1993 | European Pat. Off. . |
| 544325 | 6/1993 | European Pat. Off. . |
| 0588492A1 | 3/1994 | European Pat. Off. ........ G03F 7/004 |
| 1072155 | 3/1989 | Japan . |
| 1-228560 | 9/1989 | Japan . |
| 4-65415 | 3/1992 | Japan . |
| 1509354 | 5/1978 | United Kingdom . |
| WO90/01726 | 2/1990 | WIPO .................... G03C 1/54 |
| 93/12152 | 6/1993 | WIPO . |
| 93/18437 | 9/1993 | WIPO . |
| 94/01807 | 1/1994 | WIPO . |
| 94/12912 | 6/1994 | WIPO . |
| 94/14858 | 7/1994 | WIPO . |
| 94/14863 | 7/1994 | WIPO . |
| WO96/12214 | 4/1996 | WIPO .................... G03F 7/022 |
| WO96/20965 | 7/1996 | WIPO .................... C08G 8/00 |
| WO96/21175 | 7/1996 | WIPO .................... G03F 7/023 |
| WO96/21176 | 7/1996 | WIPO .................... G03F 7/023 |

OTHER PUBLICATIONS

"Deionised Water Plants for Semiconductor Device Fabrication" G. Noti and R. Vaughan, Proc. Inst. Radio & Electron. Eng. Australia, vol. 34, No. 2, Mar. 1973 pp. 45–51.

Derwent Publications Ltd., London, GB; JP-A-05234876, OCG Microelectronic Materials, Sep. 10, 1993.

Kimura et al; "Purification of Formaldehyde"; Mar. 9, 1977; CA87(7):52776y. Abstract of JP 52/31,013.

Bayard; "Water Free of Heavy Metals for Medical use and Ion Exchange Resin Used in its Preparation" Nov. 16, 1992; CA98(26):221589z, Abstract of FR 2 506 286.

Hirai et al; "Treatment of Waste Waters Containing Formaldehyde and Metals with Chelating Ion Exchange Resins"; Nov. 5, 1975; CA84(14):95328j. Abstract of JP 50/138.651.

Journal of the Electrochemical Society, vol. 137, No. 12, Dec. 1990, Manchester, New Hampshire US, pp. 3900–3905, XP0001681, T. Tanaka "A New Photolithography Tech. w/Antireflective . . . ".

Chemical Abstracts, vol. 112, No. 18, Apr. 30, 1990, Columbus, OH, p. 17, the Abstract 159201u, JP-A-1190713 (Inatomi, Shigeki et al) Jul. 31, 1989.

"Amberlite Ion Exchange Resins Laboratory Guide" by Rohm and Haas Company, Philadelphia, PA, Sep. 1979.

Primary Examiner—Mark F. Huff
Attorney, Agent, or Firm—Andrew F. Sayko, Jr.

[57] ABSTRACT

The present invention provides methods for producing top anti-reflective coating compositions having a very low level of metal ions, utilizing specially treated ion exchange resins. A method is also provided for producing semiconductor devices using such top anti-reflective coating compositions.

10 Claims, No Drawings

5,624,789

METAL ION REDUCTION IN TOP ANTI-REFLECTIVE COATINGS FOR PHOTORESISIS

This is a divisional of application Ser. No. 08/258,898 filed on Jun. 10, 1994, now U.S. Pat. No. 5,516,886, which is a continuation of Ser. No. 07/984,655 filed on Dec. 2, 1992, now abandoned, which is a continuation in part of Ser. No. 07/911,604 filed on Jul. 10, 1992, now abandoned.

BACKGROUND OF THE INVENTION

The present invention relates to a process for producing top anti-reflective coatings for photoresists, which coatings have a very low level of metal ions, especially sodium and iron, and for using such top anti-reflective coatings with light-sensitive photoresist compositions to produce semiconductor devices. Further, the present invention relates to a process for coating substrates already coated with a photoresist composition with these top anti-reflective coating compositions, as well as the process of coating, imaging and developing light-sensitive photoresist compositions coated with such anti-reflective coatings on such substrates.

Thin film interference plays a central role in the process control of optical microlithography. Small variations in the thickness of resist or of thin films underneath the resist cause large exposure variations, which in turn cause two classes of undesirable line width variations.

1. As thin film thickness may vary from run to run, wafer to wafer, or across a wafer, line widths will vary from run to run, wafer to wafer or across a wafer.
2. As patterning takes place over wafer topography, the resist thickness unavoidably changes at the topography edge causing the line width to vary as it crosses the edge.

Avoiding such thin film interference effects is one of the key advantages of advanced processes such as X-Ray lithography or multi-layer resist systems. However, Single Layer Resist (SLR) processes dominate semiconductor manufacturing lines because of the their simplicity and cost-effectiveness, and also because of the relative cleanliness of wet developed processes compared with dry processes.

Thin film interference results in periodic undulations in a plot of the exposure dose required to clear positive photoresist (termed dose-to-clear) versus the photoresist thickness. Optically, on a resist-coated substrate, light reflected from the bottom mirror (due to the effect of the substrate+thin films) interferes with the refection of the top mirror (the resist/air interface).

As optical lithography pushes towards shorter wavelengths, thin film interference effects become increasingly important. More severe swings in intensity are seen as wavelength decreases.

One strategy for reducing thin film interference is to reduce the substrate reflectivity through the use of absorptive Anti-Reflective Coats. One way of doing this is to apply a Top Anti-Reflector coating on top of the photoresist prior to exposure.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist and all of the anti-reflective coating from the surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in the photoresist or in a coating on the photoresist, can cause contamination especially during plasma stripping. However, these problems have been overcome to a substantial extent during the fabrication process, for example, by utilizing HCL gathering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems can be the metal contamination in the anti-reflective coating on the photoresist, particularly sodium and iron ions. Metal levels of as low as 1.0 ppm or less can adversely affect the properties of such semiconductor devices.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble in the developer solution (e.g. a rearrangement reaction occurs) while those areas not exposed remain relatively insoluble in the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less then one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing top anti-reflective coatings containing very low levels of metal ions, especially sodium and iron. The invention further relates to a process for producing semiconductor devices using such top anti-reflective coatings for photoresists.

The process of the subject invention provides a top anti-reflective coating having a very low level of metal ions. The anti-reflective coating is applied on top of a photoresist, which may be either negative or positive working, although positive photoresists are preferred.

The top anti-reflective coatings obtained have very low levels of metal ions such as iron, sodium, potassium, calcium, magnesium, copper and zinc. The moral metal ion level is preferably less than 1 ppm, more preferably less than 500 ppb. Sodium and iron are the most common metal ion contaminants and among the easiest to detect. The level of these metal ions serves as an indicator of the level of other metal ions. The level of sodium and iron ions, are each respectively, less than 200 ppb, preferably less than 100 ppb, more preferably less than 50 ppb, even more preferably less than 20 ppb and most preferably less than 10 ppb.

DETAILED DESCRIPTION OF THE PREFERRED EMBODIMENT

The present invention provides a process for producing a top anti-reflective coating having a very low level of metal ions, particularly sodium and iron. In the preferred embodiment, the process utilizes an acidic ion exchange resin to purify the top anti-reflective coating. The subject process comprises:

a) treating an acidic ion exchange resin with water, preferably deionized water, followed by a mineral acid solution (e.g. a 5–98% solution of sulfuric, nitric or hydrochloric acid) to reduce the level of sodium and iron ions in the ion exchange resin to less than 500 ppb each, preferably less than 200 ppb, more preferably less than 100 ppb and most preferably no more than 40 ppb;

b) providing a solution of 5 to 40 weight percent of a water soluble organic carboxylic acid polymer having a molecular weight of from about 500 to about 100,000, preferably from about 1,000 to about 10,000, in a suitable solvent;

c) passing the water soluble organic carboxylic acid polymer solution through the ion exchange resin and reducing the level of total sodium and iron ions in the solution to less than 200 ppb each, preferably less than 100 ppb, more preferably less than 50 ppb, even more preferably less than 20 ppb and most preferably less than 10 ppb;

(d) formulating a top anti-reflective coating composition by providing an admixture of:
  (1) the treated water soluble organic carboxylic acid;
  (2) a fluorine containing water sparingly soluble (0.1%–10% by weight in water, preferably 0.5%–5% by weight) organic ($C_3$–$C_{13}$) aliphatic carboxylic acid;
  (3) an ammonium hydroxide; and
  (4) a suitable solvent.

Prior to formulating the top anti-reflective coating composition, a solution of the fluorine containing sparingly water soluble organic aliphatic carboxylic acid in a suitable solvent is preferably passed through the ion exchange resin and the level of sodium and iron ions in the solution reduced to less than 200 ppb each, preferably less than 100 ppb, more preferably less than 50 ppb, even more preferably less than 20 ppb and most preferably less than 10 ppb.

The solvents for the water soluble organic carboxylic acid, the sparingly water soluble halogen containing organic aliphatic carboxylic acid and the top anti-reflective coating are preferably deionized, e.g. deionized water or deionized diglyme or mixture of deionized water and deionized diglyme.

Prior to formulating the final top anti-reflective coating, preferably an admixture is provided of:
  (1) the treated water soluble organic carboxylic acid;
  (2) the treated halogen containing sparingly water-soluble organic aliphatic carboxylic acid; and
  (3) a suitable solvent.

The admixture is then passed through the ion exchange resin and the level of total sodium and iron ions in the solution reduced to less than 100 ppb each, preferably less than 50 ppb, more preferably less than 20 ppb and moss preferably less than 10 ppb. The ammonium hydroxide is then added to the admixture to provide a top antireflective coating having a very low level of metal ions.

Preferably, prior to the ion exchange resin treating of the water soluble organic carboxylic acid, the sparingly water soluble halogen containing organic aliphatic carboxylic acid or the admixture of these two components, the ion exchange resin is treated with a solvent which is the same as or at least compatible with the solvent for the component or mixture of components which is to be treated with the ion exchange resin. Most preferably, the ion exchange resin is treated with sufficient new solvent to substantially remove other solvents and to saturate the ion exchange resin with the new solvent.

An acidic ion exchange resin, such as a styrene/divinylbenzene cation exchange resin, is utilized in the present process. Such ion exchange resins are available from Rohm and Haas Company, e.g. AMBERLYST 15 resin. These resins typically contain as much as 80,000 to 200,000 ppb each of sodium and iron. Before utilized in the process of the invention, the ion exchange resin must be treated with water and then a mineral acid solution to reduce the metal ion level. Preferably the ion exchange resin is initially rinsed with deionized water, followed by a mineral acid solution, such as a 10 percent sulfuric acid solution, rinsed again with deionized water, treated again with the mineral acid solution and once more rinsed with deionized water. Before purifying the antireflective coating composition solution, it is critical that the ion exchange resin is first rinsed with a solvent which is the same as, or at least compatible with, the antireflective coating composition solvent.

If the anti-reflective coating or any of its components contains one or more constituents which will react chemically with the acidic ion exchange resin, the anti-reflective coating or component is preferably initially formulated without such constituents, e.g. the ammonium hydroxide. This will provide an anti-reflective coating or component substantially free of any constituents which will react with the acidic ion exchange resin. After purification, such constituents are added to the anit-reflective coating.

The solution of the anti-reflective coating or component is passed through a column containing the ion exchange resin, e.g. a solution of from about 1 to 40 weight percent in a suitable solvent. Such solutions may typically contain from 500 to 20,000 ppb each of sodium and iron ions. During the process of the present invention, these levels are each reduced to as low as 10 ppb each, or less.

The present invention provides a process for producing a top anti-reflective coating having a very low level of metal ions and a process for producing semiconductor devices using such anti-reflective coatings. The anti-reflective coating is formed by providing an admixture of a water soluble organic carboxylic acid, a sparingly water-soluble halogen containing organic aliphatic carboxylic acid, an ammonium hydroxide and a suitable solvent.

Suitable water soluble organic carboxylic acids include acrylic and methacrylic acids, such as poly(acrylic acid) poly(methacrylic acid). Suitable sparingly water soluble fluorine containing organic aliphatic carboxylic acids include fluorinated $C_3$–$C_{18}$ aliphatic carboxylic acids, such as pentadecafluorooctanoic acid.

Suitable solvents, which are preferably deionized, include water, diglyme, propylene glycol monoethyl ether acetate (PGMEA), ethyl lactate, ethyl-3-ethoxypropionate, mixtures of ethyl lactate and ethyl-3-ethoxy proprionate, xylene, butyl acetate cyclopentanone, cyclohexanone and ethylene glycol monoethyl ether acetate.

The solvents may be present in the overall composition in an amount of from about 75% to about 98% by weight of the solids in the composition. Solvents, of course, are substantially removed after coating of the top anti-reflective coating on a substrate and drying.

The present invention also provides a process for producing semiconductor devices using such top anti-reflective coating having a very low level of metal ions, particularly sodium and iron. In the preferred embodiment, the process utilizes an acidic ion exchange resin to purify the top anti-reflective coating. The subject process comprises:

a) treating an acidic ion exchange resin with water, preferably deionized water, followed by a mineral acid solution (e.g. a 5–98% solution of sulfuric, nitric or hydrochloric acid) to reduce the level of sodium and iron ions in the ion exchange resin to less than 500 ppb each, preferably less than 200 ppb, more preferably less than 100 ppb and most preferably no more than 40 ppb;

b) providing a solution of 5 to 40 weight percent of a water soluble organic carboxylic acid polymer having a molecular weight of from about 500 to about 100,000, preferably from about 1,000 to about 10,000, in a suitable solvent;

c) passing the water soluble organic carboxylic acid polymer solution through the ion exchange resin and reducing the level of sodium and iron ions in the solution to less than 200 ppb each, preferably less than 100 ppb, more preferably less than 50 ppb, even more preferably less than 20 ppb and most preferably less than 10 ppb;

d) formulating a top anti-reflective coating composition by providing an admixture of:

(1) the treated water soluble organic carboxylic acid;
(2) a fluorine containing water sparingly soluble (0.1%–10% by weight in water, preferably 0.5%–5% by weight) organic ($C_3$–$C_{13}$) aliphatic carboxylic acid;
(3) an ammonium hydroxide; and
(4) a suitable solvent.

Prior to formulating the top anti-reflective coating composition, a solution of the fluorine containing sparingly water soluble organic aliphatic carboxylic acid in a suitable solvent is preferably passed through the ion exchange resin and the level of sodium and iron ions in the solution reduced to less than 200 ppb each, preferably less than 100 ppb, more preferably less than 50 ppb, even more preferably less than 20 ppb and most preferably less than 10 ppb.

The solvents for the water soluble organic carboxylic acid, the sparingly water soluble halogen containing organic aliphatic carboxylic acid and the top anti-reflective coating are preferably deionized, e.g. deionized water or deionized diglyme or mixture of deionized water and deionized diglyme.

Prior to formulating the final top anti-reflective coating, preferably an admixture is provided of:

(1) the treated water soluble organic carboxylic acid;
(2) the treated halogen containing sparingly water-soluble organic aliphatic carboxylic acid; and
(3) a suitable solvent.

The admixture is then passed through the ion exchange resin and the level of sodium and iron ions in the solution reduced to less than 100 ppb each, preferably less than 50 ppb, more preferably less than 20 ppb and most preferably less than 10 ppb. The ammonium hydroxide is then added to the admixture to provide a top antireflective coating having a very low level of metal ions.

The prepared top anti-reflective coating is then applied to a suitable substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The top anti-reflective coatings produced by the described procedure are particularly suitable for application to thermally grown silicon/silicon dioxide-coated wafers, such as are utilized in the production of microprocessors and other miniaturized integrated circuit components. An aluminum/ aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The top anti-reflective coating is coated onto the substrate over the photoresist composition, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist and anti-reflective coating, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The substrate is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are then developed to remove the image-wise exposed areas such as by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

1000 grams of a 7 weight percent solution of polyacrylic acid in deionized water was passed through a column of Amberlyst 15 ion exchange resin which had been cleaned with deionized water, 10% sulfuric acid and then sufficient deionized water to remove the sulfuric acid. The untreated polyacrylic acid solution had a metal ion content as follows: 6800 ppb sodium, 1200 ppb potassium, 400 ppb calcium, <10 ppb iron and <10 ppb aluminum. The solution treated according to the procedure of Example 2 was sampled after, respectively, 179 grams, 330 grams and 525 grams of the polyacrylic acid solution had been passed through the AMBERLYST resin column. The treated samples had a very low level of metal ions as follows:

| SAMPLE | 179 GRAMS | 330 GRAMS | 525 GRAMS |
| --- | --- | --- | --- |
| Sodium | 20 ppb | <10 ppb | <10 ppb |
| Potassium | <20 ppb | <20 ppb | <20 ppb |
| Calcium | <20 ppb | <20 ppb | <20 ppb |
| Iron | <10 ppb | <10 ppb | <10 ppb |
| Aluminum | <10 ppb | <10 ppb | <10 ppb |

EXAMPLE 2

17 pounds of AMBERLYST 15 ion exchange resin beads which were rinsed with deionized water were placed in a 0.45 cubic foot canister. The canister was connected through a pump to a drum with a stainless steel tube. 25 gal. of 10 percent sulfuric acid was passed through the canister using a pump, at a rate of 0.35 gal. per minute. 200 gal. of deionized water was passed through the canister at the same rate to remove the sulfuric acid until the pH of the effluent is equal to the pH of the deionized water. 200 gal. of a 10 weight percent polyacrylic acid solution in deionized water was prepared. The solution had a sodium ion level of 360 ppb, an iron level of 190 ppb, a potassium ion level of 600 ppb, a chromium ion level of 20 ppb and a calcium ion level of 2600 ppb and was passed through the resin canister at the same rate and collected in a clean drum. The polyacrylic acid solution obtained had a very low level of metal ions as follows: sodium—93 ppb, iron—20 ppb, potassium—13 ppb, calcium—74 ppb and chromium—9 ppb.

EXAMPLE 3

The treated polyacrylic acid solution of Example 2 was again passed through the resin canister of Example 2, according to the procedure of Example 2. The polyacrylic acid solution obtained had an even lower level of metal ions as follows: sodium—11 ppb, iron—5 ppb, potassium—5 ppb, calcium—34 ppb and chromium—5 ppb.

EXAMPLE 4

A solution of 4.0 weight percent of pentadecafluorooctanoic acid in deionized water was prepared. The solution was passed through the resin canister of Example 1, according to the procedures of Example 1. The pentadecafluorooctanoic acid solution obtained had a low level of metal ions as follows: sodium—less than 10 ppb and iron—less than 10 ppb.

EXAMPLE 5

A solution was prepared from 3.35 weight percent of treated pentadecafluorooctanoic acid of Example 4, 1.65 weight percent of the treated polyacrylic acid of Example 2, 1.0 weight percent of tetramethylammonium hydroxide and 94.0 weight percent deionized water. The anti-reflective coating obtained had a low level of metal ions as follows: sodium—<10 ppb and iron—<20 ppb.

The coating was capable of forming a 717A° film at 4000 RPM with a refractive index of 1.41 for the coated film.

We claim:

1. A method for producing semiconductor devices using a top anti-reflective coating having a very low level of metal ions comprising:

a) treating an acidic ion exchange resin with water, washing said ion excahnge resin with a mineral acid solution and thereby reducing the level of sodium and iron ions in the ion exchange resin to less than 500 ppb each;

b) providing a solution of 5 to 40 weight percent of a water soluble organic carboxylic acid polymer having a molecular weight of from about 500 to about 100,000 in a solvent for said carboxylic acid polymer;

c) passing the water soluble organic carboxylic acid polymer solution through the ion exchange resin and thereby reducing the level of sodium and iron ions in the solution to less than 200 ppb each;

d) formulating a top anti-reflective coating composition solution by providing an admixture of:
   (1) the treated water soluble organic carboxylic acid polymer;
   (2) a fluorine containing water sparingly soluble aliphatic carboxylic acid;
   (3) an ammonium hydroxide; and
   (4) a solvent for said admixtures;

e) passing the solution of the fluorine containing sparingly water soluble organic aliphatic carboxylic acid through the ion exchange resin and thereby reducing the level of sodium and iron ions in the solution to less than 200 ppb each;

f) coating the top anti-reflective coating of step (e) onto a substrate which has been coated with a photoresist composition;

g) heating the substrate at a temperature from about 70° C. to about 110° C. for from about 30 seconds to about 180 seconds on a hot plate or for from about 15 to about 90 minutes in a convection oven;

h) exposing the coated substrate to actinic radiation in any desired pattern to provide image-wise exposed areas;

i) developing the exposed coated substrates and thereby removing the image-wise exposed areas.

2. The method of claim 1 wherein, prior to formulating the top anti-reflective coating composition, a solution of the fluorine containing sparingly water soluble organic aliphatic carboxylic acid is passed through an acidic ion exchange resin and the level of sodium and iron ions in the solution is reduced to less than 200 ppb each.

3. The method of claim 2 wherein, prior to formulating the top anti-reflective coating composition, an admixture is provided of:

(1) the water soluble organic carboxylic acid polymer;

(2) the fluorine containing sparingly water-soluble organic aliphatic carboxylic acid; and (3) a solvent;

the admixture is then passed through the acidic ion exchange resin and the level of total sodium and iron ions in the solution is thereby reduced to less than 100 ppb each; and ammonium hydroxide is then added to the admixture to provide a top antireflective coating having a very low level of metal ions.

4. The method of claim 1 wherein the level of total sodium and iron ions in the ion exchange resin is reduced to less than 200 ppb.

5. The method of claim 4 wherein the level of sodium and iron ions in the ion exchange resin is reduced to less than 100 ppb each.

6. The method of claim 1 wherein the sodium and iron ion level in the top anti-reflective-coating composition is reduced to less than 100 ppb each.

7. The method of claim 1 wherein the sodium and iron ion level in the top-anti-reflective coating composition is reduced to less than 50 ppb each.

8. The method of claim 1 wherein the ion exchange resin has a sodium and iron ion level of less than 100 ppb each and the resulting anti-reflective coating composition solution has a sodium and iron level of less than 50 ppb each at the end of step a).

9. The method of claim 1 wherein, prior to the ion exchange resin treating of the water soluble organic carboxylic acid polymer, the sparingly water soluble fluorine containing organic aliphatic carboxylic acid or the admixture of these two components, the ion exchange resin is treated with a solvent which is compatible with the solvent for the composition which is to be treated with the ion exchange resin.

10. The method of claim 1 wherein the ion exchange resin has a sodium and iron ion level of less than 40 ppb each and the resulting top anti-reflective coating has a sodium and iron ion level of less than 20 ppb each at the end of step a).

\* \* \* \* \*